United States Patent
Tsuboi

(10) Patent No.: US 10,438,988 B2
(45) Date of Patent: Oct. 8, 2019

(54) PHOTOELECTRIC CONVERSION DEVICE AND IMAGING SYSTEM

(71) Applicant: CANON KABUSHIKI KAISHA, Tokyo (JP)

(72) Inventor: Hiromasa Tsuboi, Tama (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 15/631,411

(22) Filed: Jun. 23, 2017

(65) Prior Publication Data

US 2018/0012928 A1 Jan. 11, 2018

(30) Foreign Application Priority Data

Jul. 7, 2016 (JP) ................................. 2016-134910

(51) Int. Cl.
*H01L 27/148* (2006.01)
*H01L 27/146* (2006.01)

(52) U.S. Cl.
CPC .. *H01L 27/14806* (2013.01); *H01L 27/14609* (2013.01); *H01L 27/14636* (2013.01)

(58) Field of Classification Search
CPC ......... H01L 27/14806; H01L 27/14609; H01L 27/14636
USPC ....................... 257/225; 250/208.1; 348/308
See application file for complete search history.

(56) References Cited

U.S. PATENT DOCUMENTS

| | | | |
|---|---|---|---|
| 2005/0237405 A1 | 10/2005 | Ohkawa | |
| 2013/0222630 A1 | 8/2013 | Hashimoto | |
| 2014/0319321 A1* | 10/2014 | Wada | H04N 5/23212 250/208.1 |
| 2016/0219238 A1 | 7/2016 | Tsuboi | |
| 2017/0125464 A1 | 5/2017 | Abe | |

FOREIGN PATENT DOCUMENTS

JP  2015-185823  10/2015

OTHER PUBLICATIONS

U.S. Appl. No. 15/631,391, filed Jun. 23, 2017, by Hiromasa Tsuboi et al.

* cited by examiner

*Primary Examiner* — Tong-Ho Kim
(74) *Attorney, Agent, or Firm* — Venable LLP

(57) ABSTRACT

Provided is a photoelectric conversion device including: a photoelectric conversion portion in a substrate that photoelectrically converts incident light to generate charges; a transfer transistor including a control electrode on the substrate that transfers the charges from the photoelectric conversion portion; wiring layers above the control electrode; a first wiring in a first wiring layer of the wiring layers that is the closest to the substrate; and a drive wiring in a second wiring layer above the first wiring layer, a control signal for controlling the transfer transistor being transferred to the control electrode via the drive wiring and first wiring and, in a plan view, at least part of the first wiring overlapping with at least part of the control electrode and at least part of an edge of the first wiring extending along an edge of the control electrode on a side facing the photoelectric conversion portion.

36 Claims, 14 Drawing Sheets

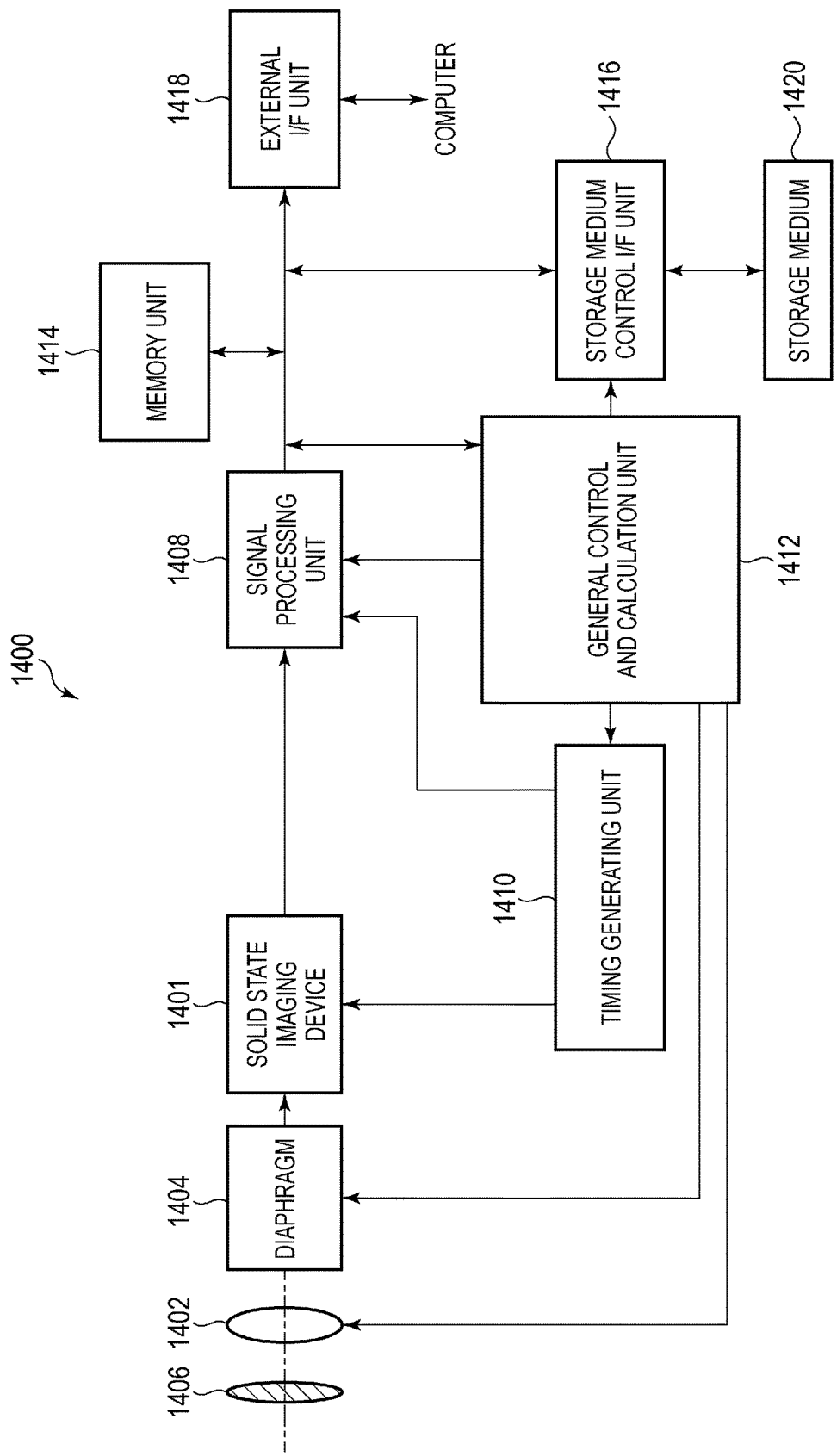

PHOTOELECTRIC CONVERSION DEVICE AND IMAGING SYSTEM

BACKGROUND OF THE INVENTION

Field of the Invention

The present invention relates to a photoelectric conversion device and an imaging system.

Description of the Related Art

Japanese Patent Application Laid-Open No. 2015-185823 discloses a solid state imaging device having a pixel and first to third wiring layers, in which the pixel includes a photoelectric conversion element and a transistor used for reading out a signal from the photoelectric conversion element. The first wiring layer is the lowermost wiring layer. The second wiring layer is arranged above the first wiring layer, and the third wiring layer is arranged above the second wiring layer. A drive wiring of the transistor is arranged in the second wiring layer.

In the pixel of the configuration described above, when a light enters a control electrode of a transistor of a pixel, the incident light may refract at the control electrode and enter a photoelectric conversion portion of another pixel neighboring the pixel. In this case, a noise may occur in the output signal from the neighboring pixel.

SUMMARY OF THE INVENTION

A photoelectric conversion device according to one embodiment of the present invention includes a substrate; a first photoelectric conversion portion that is formed in the substrate and photoelectrically converts an incident light to generate charges; a first transfer transistor that includes a first control electrode formed on the substrate and transfers the charges from the first photoelectric conversion portion; a plurality of wiring layers arranged above the first control electrode; a first wiring included in a first wiring layer of the plurality of wiring layers, the first wiring layer being the closest to the substrate; a drive wiring included in a second wiring layer arranged above the first wiring layer; and a scanning circuit that outputs a control signal for controlling the first transfer transistor, in which the control signal is transferred to the first control electrode via the drive wiring and the first wiring, and in which at least a part of the first wiring is arranged so as to overlap with at least a part of the first control electrode in a plan view, and at least a part of an edge of the first wiring is arranged so as to extend along an edge of the first control electrode, the edge of the first control electrode being on a side facing the first photoelectric conversion portion, in a plan view.

Further features of the present invention will become apparent from the following description of exemplary embodiments with reference to the attached drawings.

BRIEF DESCRIPTION OF THE DRAWINGS

FIG. 14 is a block diagram of an imaging system according to a ninth embodiment.

DESCRIPTION OF THE EMBODIMENTS

Figure 1:
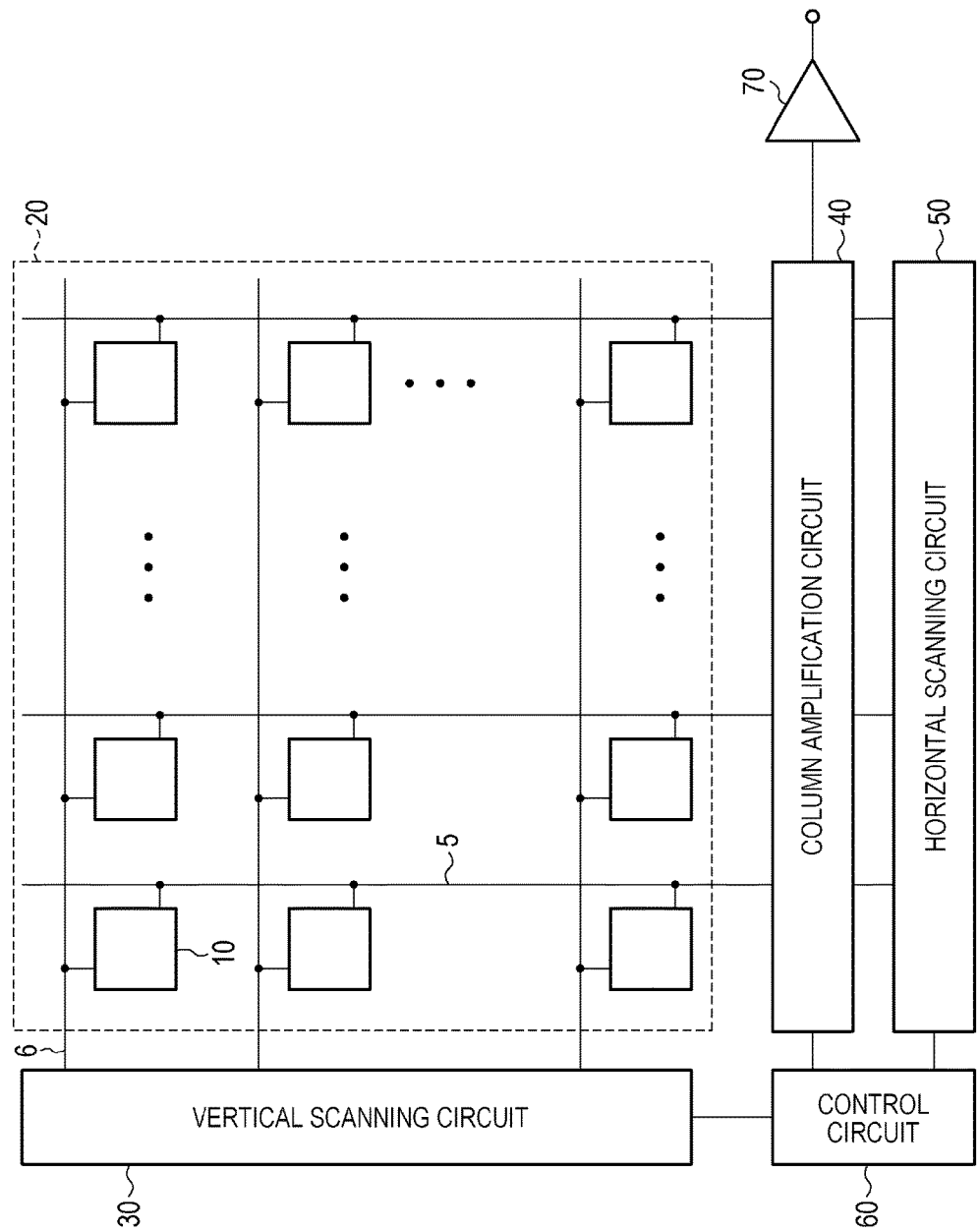
FIG. 1 is a block diagram illustrating a general configuration of a solid state imaging device according to a first embodiment.

Preferred embodiments of the present invention will now be described in detail in accordance with the accompanying drawings. In the drawings, corresponding elements are labeled with the same reference numerals, and duplicated description thereof may be omitted or simplified.

First Embodiment

FIG. 1 is a block diagram illustrating a general configuration of a solid state imaging device according to the present embodiment. The solid state imaging device may be called a Complementary Metal Oxide Semiconductor (CMOS) image sensor or the like, for example. The solid state imaging device is one of the forms of a photoelectric conversion device to which the present invention may be applied. The photoelectric conversion device may include a focus detection sensor, a light amount sensor, or the like, for example.

The solid state imaging device includes a pixel array 20, a vertical scanning circuit 30, a column amplification circuit 40, a horizontal scanning circuit 50, a control circuit 60, and an output circuit 70. These circuits may be formed on one or more semiconductor substrates. The pixel array 20 includes a plurality of pixels 10 arranged so as to form multiple rows and multiple columns. The vertical scanning circuit 30 is a scanning circuit that supplies, via control signal lines 6 provided on respective rows of the pixels 10, control signals for controlling a plurality of transistors included in the pixels 10 to be on (conductive state) or off (non-conductive state). Here, since the control signal supplied to each pixel 10 may include multiple types of control signals, the control signal line 6 on each row may be formed of a combination of a plurality of drive wirings. A column signal line 5 is provided on each column of the pixels 10, and signals from the pixels 10 are read out to the column signal line 5 on a column basis.

The column amplification circuit 40 performs amplification, correlated double sampling processing, or the like on pixel signals output to the column signal lines 5. The horizontal scanning circuit 50 supplies control signals for controlling switches connected to amplifiers of the column amplification circuit 40 to be on or off. The output circuit 70 is formed of a buffer amplifier, a differential amplifier, or the like and outputs a pixel signal from the column amplification circuit 40 to a signal processing unit outside the imaging device. Note that the solid state imaging device may further have an analog-to-digital (AD) conversion unit to be configured to output a digital image signal. For example, the column amplification circuit 40 may include an AD conversion unit. The control circuit 60 controls operation timings or the like of the vertical scanning circuit 30, the column amplification circuit 40, and the horizontal scanning circuit 50.

Figure 2:
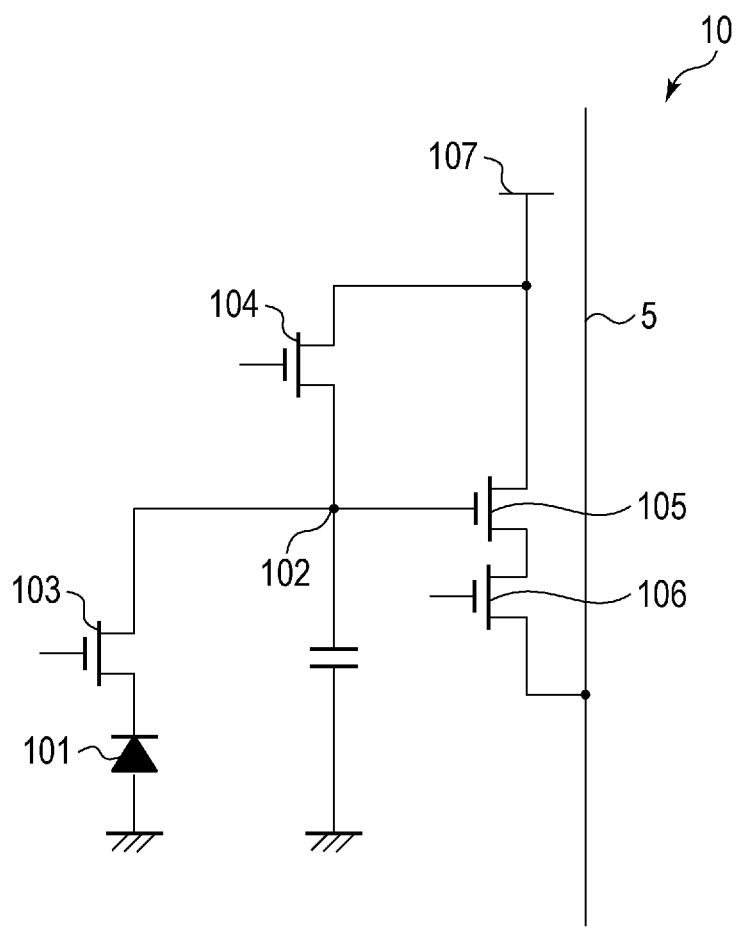
FIG. 2 is a circuit diagram of a pixel according to the first embodiment.

FIG. 2 is a circuit diagram of a pixel 10 in the solid state imaging device according to the present embodiment. The pixel 10 includes a photoelectric conversion portion 101, a floating diffusion (hereafter, referred to as FD) 102, a transfer transistor 103, a reset transistor 104, a source follower transistor (hereafter, referred to as SF transistor) 105, and a selection transistor 106. Each of these transistors may be formed of a MOS transistor having a gate electrode as a control electrode. To respective gates of the transfer transistor 103, the reset transistor 104, and the selection transistor 106, control signals for controlling these transistors are input via the control signal line 6 from the vertical scanning circuit 30.

The photoelectric conversion portion 101 (first photoelectric conversion portion) is a photoelectric conversion element that generates charges in accordance with an incident light by photoelectric conversion and accumulates these charges. The photoelectric conversion portion 101 may be formed of a photodiode formed inside a semiconductor substrate. When turned on, the transfer transistor 103 (first transfer transistor) transfers charges of the photoelectric conversion portion 101 to the FD 102. The FD 102 is a diffusion region connected to the gate electrode of the SF transistor 105. A capacitor connected to the FD 102 in FIG. 2 illustrates the capacitance occurring at the FD 102. This capacitance causes the potential of the FD 102 to vary in accordance with charges transferred from the photoelectric conversion portion 101. The drain of the SF transistor 105 is connected to a power supply voltage line 107. The source of the SF transistor 105 is connected to the column signal line 5 via the selection transistor 106. The SF transistor 105 forms a source follower circuit with a constant current source (not shown) connected to the column signal line 5. This source follower circuit outputs a signal based on the voltage of the FD 102 to the column signal line 5 via the selection transistor 106. The drain of the reset transistor 104 is connected to the power supply voltage line 107, and the source of the reset transistor 104 is connected to the FD 102. When turned on, the reset transistor 104 resets the potential of the FD 102.

Figure 3:
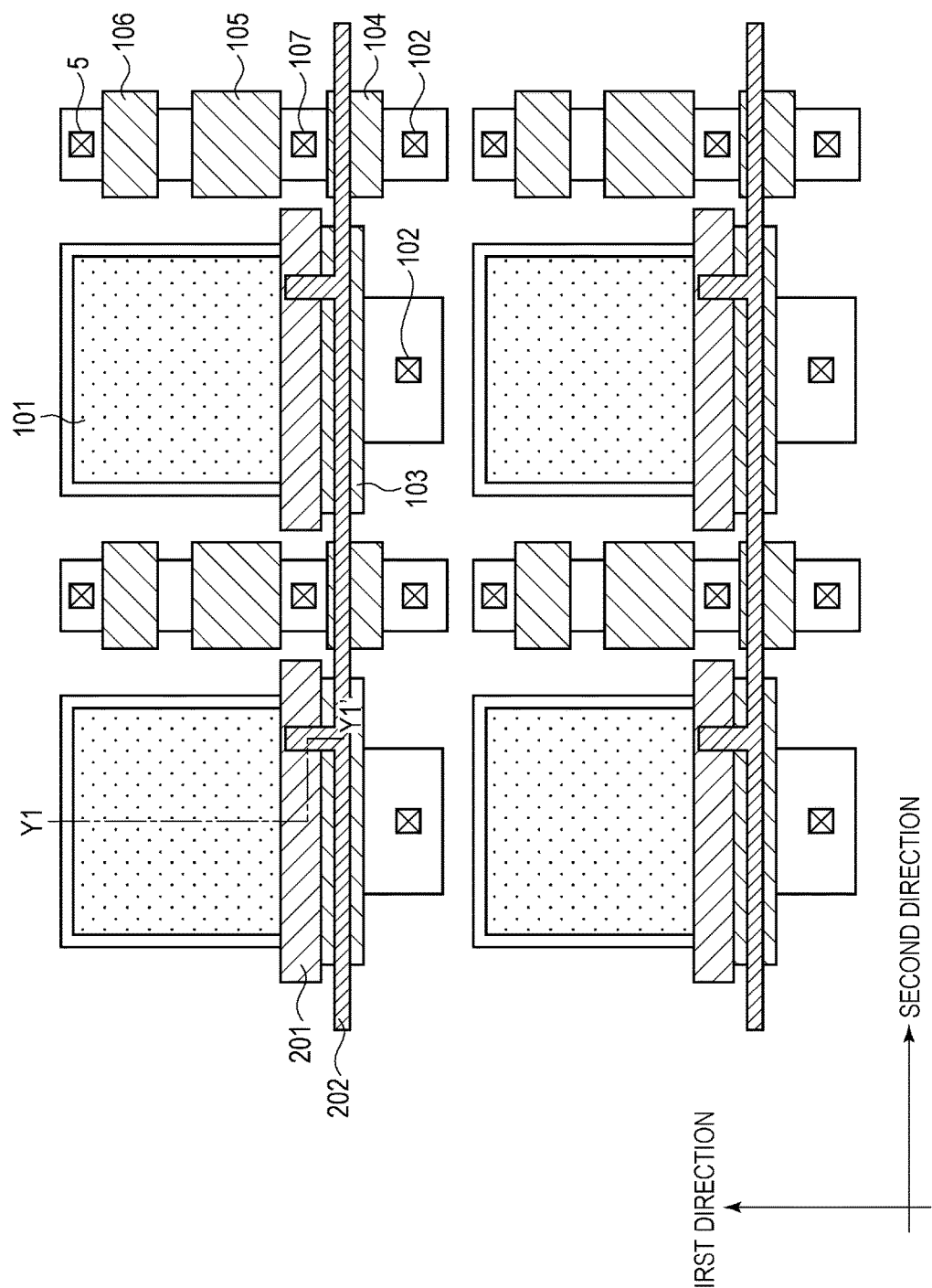
FIG. 3 is a schematic plan view of pixels according to the first embodiment.

Next, the configuration of the pixel 10 will be described with reference to FIG. 3 and FIG. 4. FIG. 3 is a schematic view of the pixels 10 in a plan view. Although FIG. 3 depicts only the pixels 10 of two rows by two columns of the pixel array 20, there may be multiple pixels 10 forming more rows by more columns in the actual implementation. With respect to the transfer transistor 103, the reset transistor 104, the SF transistor 105, and the selection transistor 106, FIG. 3 depicts gate electrodes thereof formed on a substrate. Respective gate electrodes are labeled with reference numerals corresponding to respective transistors. With respect to the column signal line 5 and the power supply voltage line 107, FIG. 3 depicts contact portions to which the wirings thereof are connected. Each contact portion is labeled with a reference numeral corresponding to the column signal line 5 or the power supply voltage line 107. Reference numerals corresponding to the FD 102 are provided to two contact portions to which wirings for conduction from the FD 102 to the SF transistor 105 or the like are connected.

FIG. 3 further depicts connection wirings 201 and drive wirings 202. The connection wiring 201 (first wiring) is a wiring that connects the gate electrode of the transfer transistor 103 to the drive wiring 202. The connection wiring 201 is formed in a first wiring layer, which is the closest to the substrate, of a plurality of wiring layers arranged above the gate electrode. The connection wiring 201 is arranged such that at least a part thereof overlaps with the gate electrode of the transfer transistor 103 in a plan view. Furthermore, at least a part of an edge of the connection wiring 201 is shaped so as to extend along an edge of the gate electrode of the transfer transistor 103, in which the edge of the gate electrode is on the side facing the photoelectric conversion portion 101 in a plan view. The drive wiring 202 is formed in a second wiring layer above the first wiring layer on which the connection wiring 201 is formed. The drive wiring 202 is one of the plurality of drive wirings forming the control signal line 6, and is a wiring that transmits a control signal output from the vertical scanning circuit 30 to the gate electrode of the transfer transistor 103.

Figure 4:
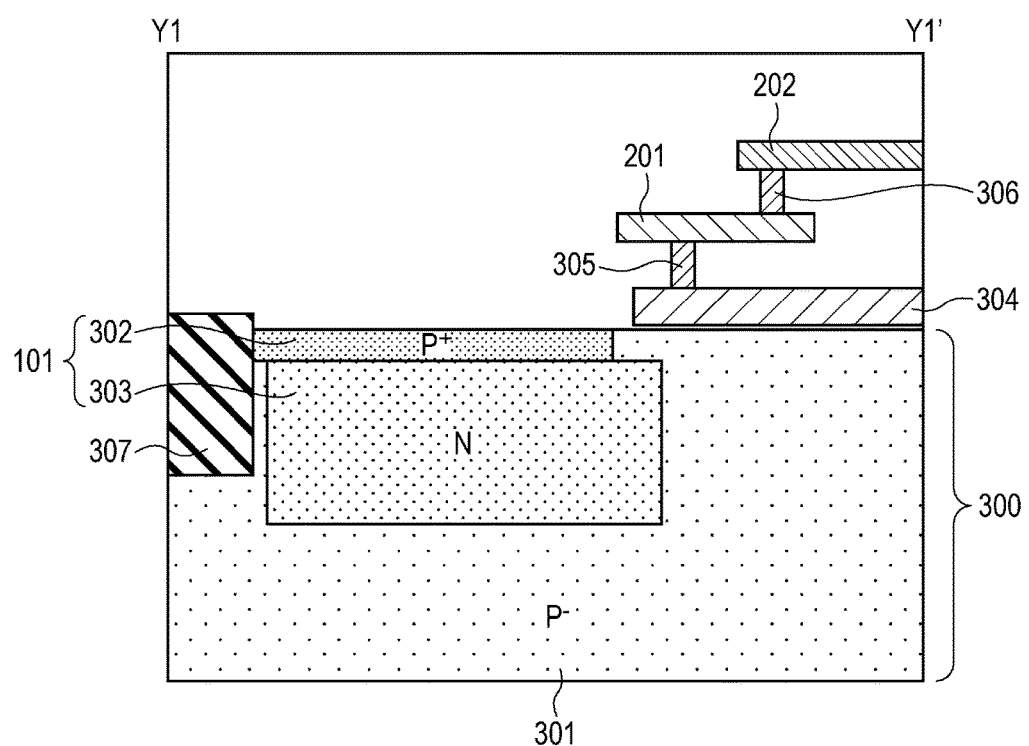
FIG. 4 is a schematic sectional view of the pixel according to the first embodiment.

FIG. 4 is a schematic sectional view taken along a line Y1-Y1' of FIG. 3. The photoelectric conversion portion 101 is formed inside a semiconductor region 301 that is a P$^-$-type well layer of the semiconductor substrate 300 whose material is silicon or the like. The photoelectric conversion portion 101 has buried photodiode structure including a P$^+$-type semiconductor region 302 formed near the surface and an N-type semiconductor region 303 formed directly under the P$^+$-type semiconductor region 302. Further, an element separation region 307 is formed in the semiconductor substrate 300. Structure such as Shallow Trench Isolation (STI) separation, Local Oxidation of Silicon (LOCOS) separation, P-type diffusion layer separation, or the like may be used for the element separation region 307.

A gate electrode 304 (first control electrode) of the transfer transistor 103 is formed above the semiconductor substrate 300 via a gate insulation film (not shown), and a plurality of wiring layers are further formed above the gate electrode 304. The material of the gate electrode 304 is polysilicon or the like. The plurality of wiring layers are formed interposing each interlayer insulating film (not shown) therebetween. The connection wiring 201 formed in the first wiring layer of the plurality of wiring layers which is the closest to the substrate is connected to the gate electrode 304 via the contact portion 305. The drive wiring 202 formed on the second wiring layer arranged above the first wiring layer is connected to the connection wiring 201 via the contact portion 306. That is, the control signal output from the vertical scanning circuit 30 is transmitted to the gate electrode 304 via the drive wiring 202, the contact portion 306, the connection wiring 201, and the contact portion 305 in this order.

As illustrated in FIG. 4, according to the configuration of the present embodiment, the connection wiring 201 is formed above the gate electrode 304 of the transfer transistor 103. Since an incident light is blocked by the connection wiring 201, the incident light is less likely to enter the gate electrode 304. Further, at least a part of the edge of the connection wiring 201 is arranged so as to extend along the edge of the gate electrode 304 of the transfer transistor 103, in which the edge of the gate electrode 304 is on the side facing the photoelectric conversion portion 101, in a plan view, and the incident light is further less likely to enter the gate electrode 304. Due to these configurations, the phenomenon in which the incident light is refracted at the gate electrode 304 and enters another pixel 10 causing a noise is less likely to occur. Therefore, the photoelectric conversion device is provided which reduces a noise due to refraction of an incident light occurring at the gate electrode 304.

The configuration of the present embodiment will be more effective when, as seen in a Bayer arrangement, the pixel array 20 is formed of a pixel arrangement in which the pixels 10 having color filters of different colors are adjacent each other. In this case, color mixture may occur when a light that has passed through a color filter of one pixel 10 enters another neighboring pixel 10. According to the present embodiment, however, it is configured such that the issue of the incident light refracting at the gate electrode 304 and entering another pixel 10 is less likely to occur, which allows for providing the photoelectric conversion device in which occurrence of color mixture due to the above reason is reduced.

While the material of the plurality of wiring layers including the connection wiring 201 and the drive wiring 202 is not limited, employing such a material that does not transmit a visible light improves the effect of blocking an incident light. The material of the wiring layer may include a metal such as aluminum, copper, or the like, for example.

While any number of layers of the plurality of wiring layers may be selected, a configuration of three layers consisting of the first wiring layer, the second wiring layer, and the third wiring layer may be employed, for example. In this case, the third wiring layer arranged above the second wiring layer may include the power supply voltage line 107 and the column signal line 5.

Second Embodiment

Figure 5:
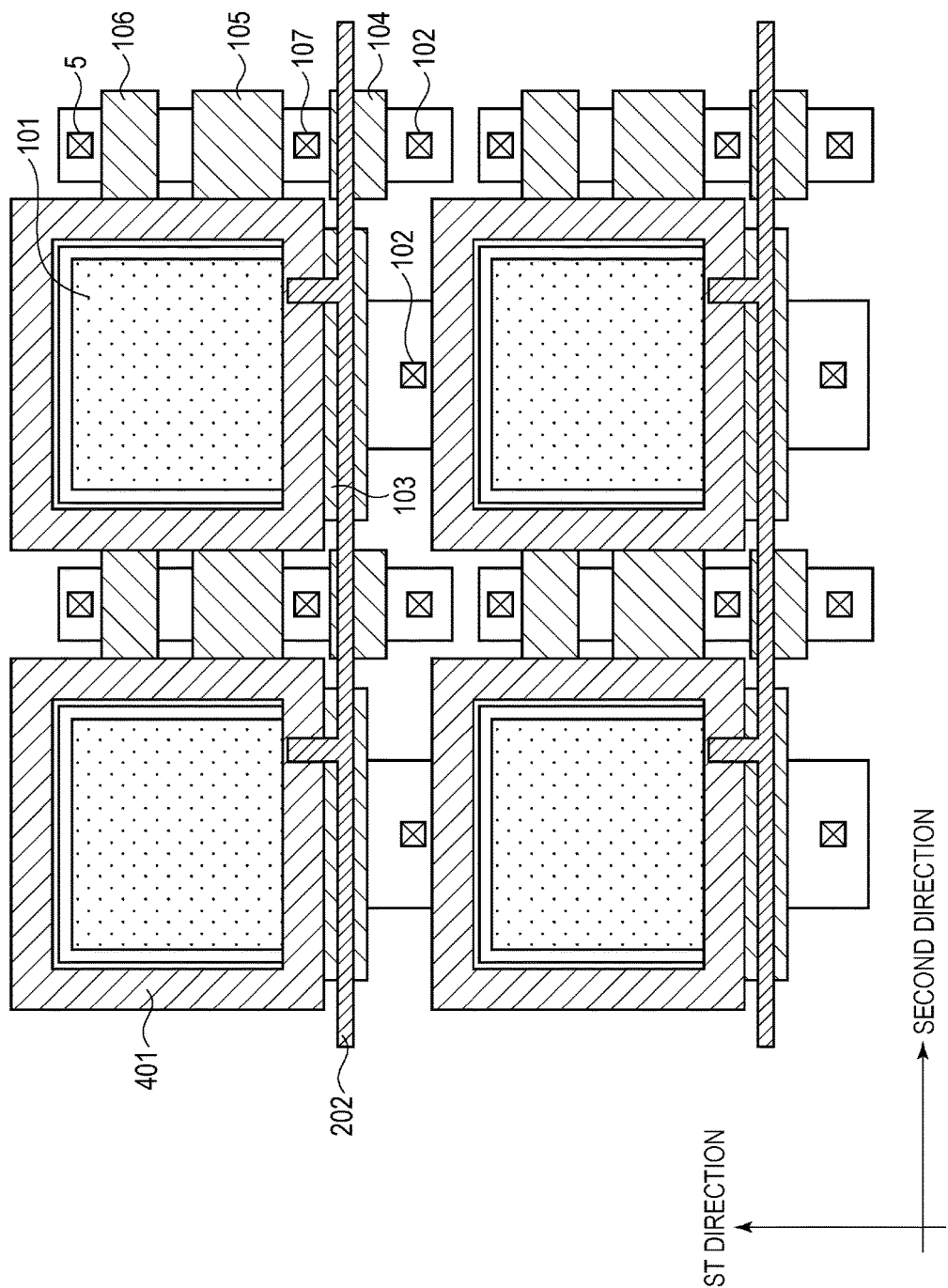
FIG. 5 is a schematic plan view of pixels according to a second embodiment.

FIG. 5 is a schematic diagram of pixels 10 in a plan view according to the second embodiment. In the present embodiment, each connection wiring 401 (first wiring) corresponding to the connection wring 201 of the first embodiment is arranged so as to surround the outer circumference of each photoelectric conversion portion 101 in a plan view. The connection wiring 401 is formed in the first wiring layer. Since other elements than the connection wiring 401 are the same as those in the first embodiment, the description thereof will be omitted.

According to this configuration, incidence of a light not only to the gate electrode 304 of the transfer transistor 103 but also to each gate electrode of the reset transistor 104, the SF transistor 105, and the selection transistor 106 is blocked by the connection wiring 401. Therefore, the present embodiment provides the photoelectric conversion device in which a noise is further reduced. Furthermore, in the present embodiment, the connection wiring 401 surrounds the outer circumference of the photoelectric conversion portion 101 in a plan view, and it is thus configured such that a light is blocked in a symmetrical manner with respect to the first direction and the second direction in FIG. 5. Thus, the connection wiring 401 of the present embodiment has an arrangement allowing a better optical symmetry of an incident light compared to the first embodiment.

Note that, although the connection wiring 401 surrounds the outer circumference of the photoelectric conversion portion 101 in a seamless manner in FIG. 5, the same advantage is obtained as long as the connection wiring 401 substantially surrounds the outer circumference of the photoelectric conversion portion 101 even when a part of the connection wiring 401 is cut.

Third Embodiment

Figure 6:
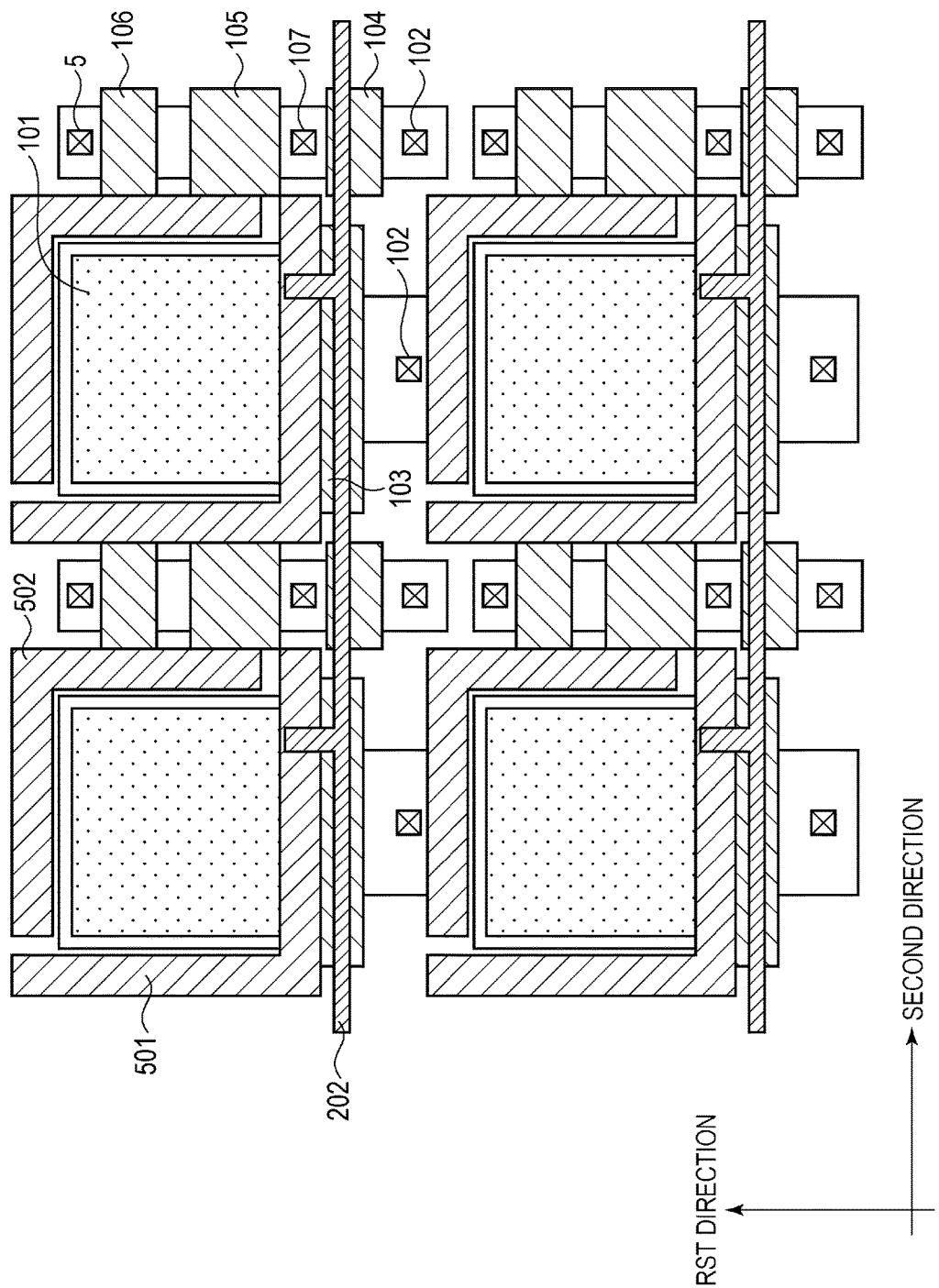
FIG. 6 is a schematic plan view of pixels according to a third embodiment.

FIG. 6 is a schematic diagram of pixels 10 in a plan view according to the third embodiment. In the present embodiment, the first wiring layer further includes a dummy wiring 502 (second wiring). Further, the wirings on the first wiring layer including a connection wiring 501 (first wiring) corresponding to the connection wiring 201 of the first embodiment and the dummy wiring 502 are arranged so as to surround the outer circumference of the photoelectric conversion portion 101 in a plan view. Since other elements than the connection wiring 501 are the same as those in the first embodiment, the description thereof will be omitted.

In a similar manner to the second embodiment, incidence of a light not only to the gate electrode 304 of the transfer transistor 103 but also to each gate electrode of the reset transistor 104, the SF transistor 105, and the selection transistor 106 is blocked by the connection wiring 501 and the dummy wiring 502. Therefore, according to the present embodiment, the same advantages as those in the second embodiment are obtained. Furthermore, according to the present embodiment, since the area of the connection wiring 501 is smaller than that in the case of the second embodiment, parasitic capacitance occurring at the transfer transistor 103 is reduced. This allows for a faster readout speed of a signal than in the case of the second embodiment. In order to obtain this advantage, the dummy wiring 502 may be in any state as long as it is not connected to the connection wiring 501. For example, the dummy wiring 502 may be in a floating state, or may be in a state where a predetermined potential such as a power supply potential, a ground potential, or the like is applied.

Note that, although substantially the entire circumference of the photoelectric conversion portion 101 is surrounded by the connection wiring 501 and the dummy wiring 502 in FIG. 6, it is not essential that substantially the entire circumference be surrounded for obtaining the effect of reducing the parasitic capacitance. That is, the dummy wiring 502 may take any form as long as at least a part of the edge of the dummy wiring 502 is arranged so as to extend along at least a part of the edge of the photoelectric conversion portion 101 in a plan view. For example, wirings on the first wiring layer including the connection wiring 501 and the dummy wiring 502 may be arranged on only two sides or three sides of the photoelectric conversion portion 101. It may be configured such that the dummy wiring 502 is arranged only on the position opposing to the connection wiring 501 interposing the photoelectric conversion portion 101 in a plan view.

Fourth Embodiment

Figure 7:
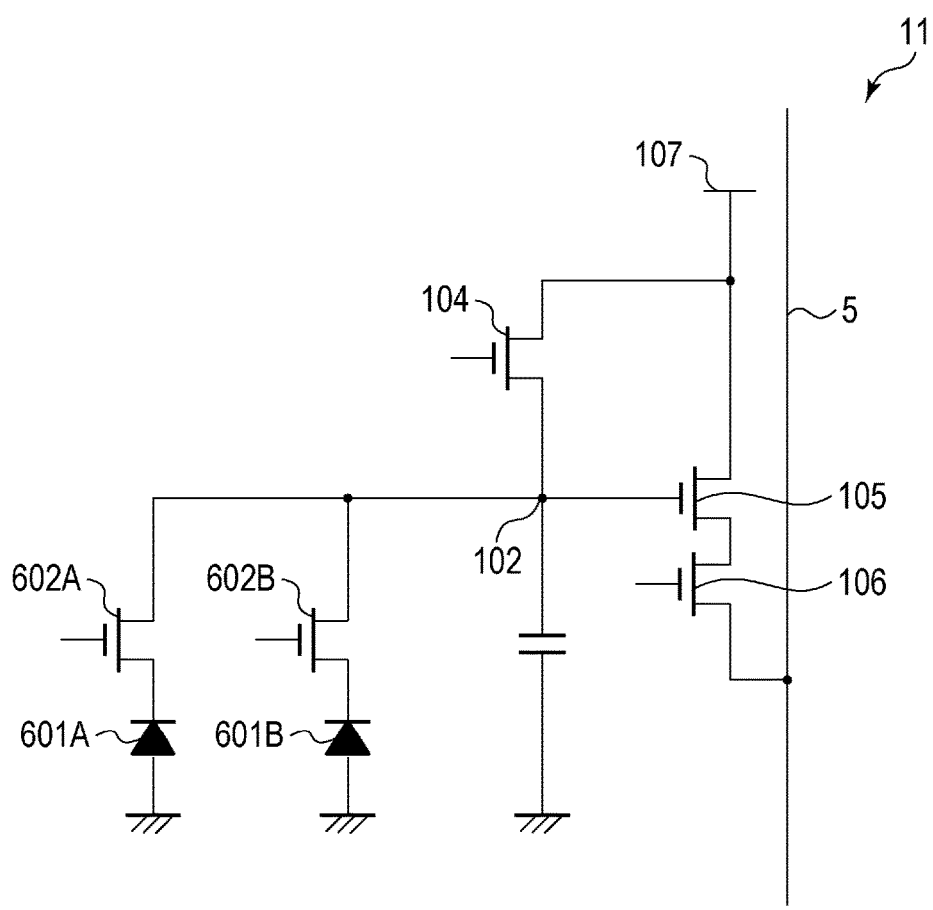
FIG. 7 is a circuit diagram of a pixel according to a fourth embodiment.
Figure 8:
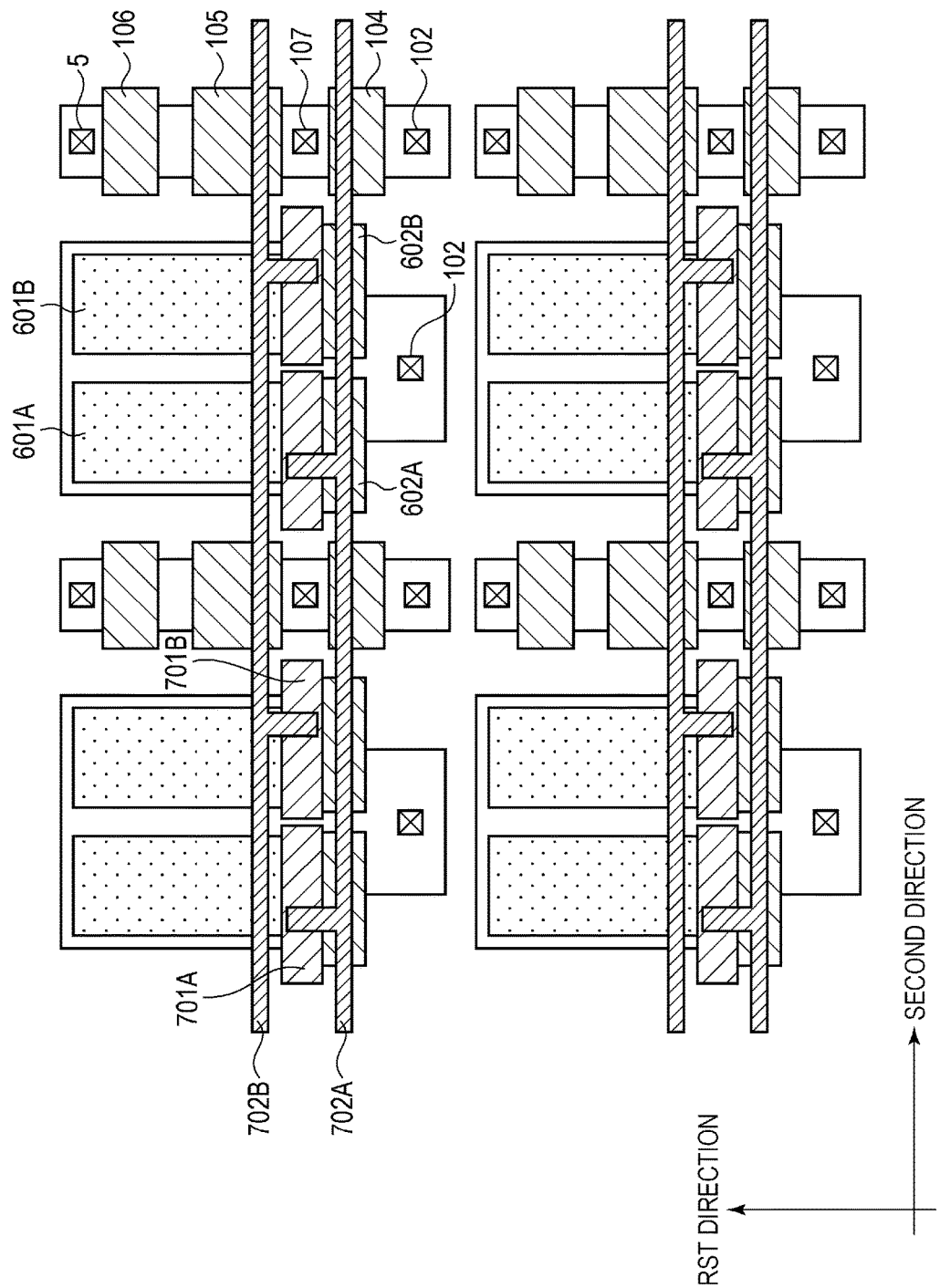
FIG. 8 is a schematic plan view of pixels according to the fourth embodiment.

FIG. 7 is a circuit diagram of a pixel 11 according to the fourth embodiment, and FIG. 8 is a schematic view of pixels 11 in a plan view according to the fourth embodiment. The circuit configuration of the pixel 11 of the present embodiment will be described with reference to FIG. 7. Description of the same configuration as that in the first embodiment will be omitted.

The pixel 11 has photoelectric conversion portions 601A and 601B and transfer transistors 602A and 602B. Each of the photoelectric conversion portions 601A and 601B is a photoelectric conversion element that generates charges in accordance with an incident light by photoelectric conversion and accumulates these charges. Each of the photoelectric conversion portions 601A and 601B may be formed of a photodiode formed inside a semiconductor substrate. When turned on, the transfer transistor 602A (first transfer transistor) transfers charges of the photoelectric conversion portion 601A (first photoelectric conversion portion) to the FD 102. When turned on, the transfer transistor 602B (second transfer transistor) transfers charges of the photoelectric conversion portion 601B (second photoelectric conversion portion) to the FD 102. That is, two photoelectric conversion portions 601A and 601B and two transfer transistors 602A and 602B share a single FD 102.

According to this circuit configuration, with two photoelectric conversion portions 601A and 601B, it is possible to output a signal used for other purposes than capturing, in addition to obtain a signal used for capturing in the same manner as in the first embodiment. Here, a signal used for other purposes than capturing may be, for example, a signal for focus detection by using a phase difference detection scheme, a signal for distance measurement, a signal obtained by photoelectically converting a light having a wavelength band different from that of a light used for capturing, or the like.

FIG. 8 is a schematic view of the pixels 11 in a plan view according to the fourth embodiment. The connection wiring 701A (first wiring) is a wiring that connects the gate electrode (first control electrode) of the transfer transistor 602A to the drive wiring 702A. The connection wiring 701B (third wiring) is a wiring that connects the gate electrode (second control electrode) of the transfer transistor 602B to the drive wiring 702B. The connection wirings 701A and 701B are formed in a first wiring layer, which is the closest to the substrate, of a plurality of wiring layers arranged above the gate electrodes. The connection wiring 701A is arranged such that at least a part thereof overlaps with the gate electrode of the transfer transistor 602A in a plan view. Furthermore, at least a part of the edge of the connection wiring 701A is shaped so as to extend along an edge of the gate electrode of the transfer transistor 602A, in which the edge of the gate electrode is on the side facing the photoelectric conversion portion 601A in a plan view. The connection wiring 701B is arranged such that at least a part thereof overlaps with the gate electrode of the transfer transistor 602B in a plan view. Furthermore, at least a part of the edge of the connection wiring 701B is shaped so as to extend along an edge of the gate electrode of the transfer transistor 602B, in which the edge of the gate electrode is on the side facing the photoelectric conversion portion 601B in a plan view.

The drive wirings 702A and 702B are formed in a second wiring layer above the first wiring layer on which the connection wirings 701A and 701B are formed. Each of the drive wiring 702A and 702B is one of the plurality of drive wirings of the control signal line 6. The drive wiring 702A is a wiring that transmits a control signal output from the vertical scanning circuit 30 to the gate electrode of the transfer transistor 602A. The drive wiring 702B is a wiring that transmits a control signal output from the vertical scanning circuit 30 to the gate electrode of the transfer transistor 602B.

According to the configuration of the present embodiment, the connection wirings 701A and 701B are formed above the gate electrodes of the transfer transistors 602A and 602B, respectively. Since an incident light is blocked by the connection wirings 701A and 701B, the incident light is less likely to enter these gate electrodes. Further, at least a part of each edge of the connection wirings 701A and 701B is arranged so as to extend along each edge of the gate electrodes of the corresponding transfer transistors 602A and 602B, in which each of the edges of the gate electrodes is on the side facing the respective photoelectric conversion portions 601A and 601B, in a plan view. Therefore, the incident light is further less likely to enter the gate electrodes. In such a way, even with the circuit configuration where two photoelectric conversion portions 601A and 601B and two transfer transistors 602A and 602B share a single FD 102, a noise due to refraction of an incident light at the gate electrode is reduced in a similar manner to the first embodiment.

Fifth Embodiment

Figure 9:
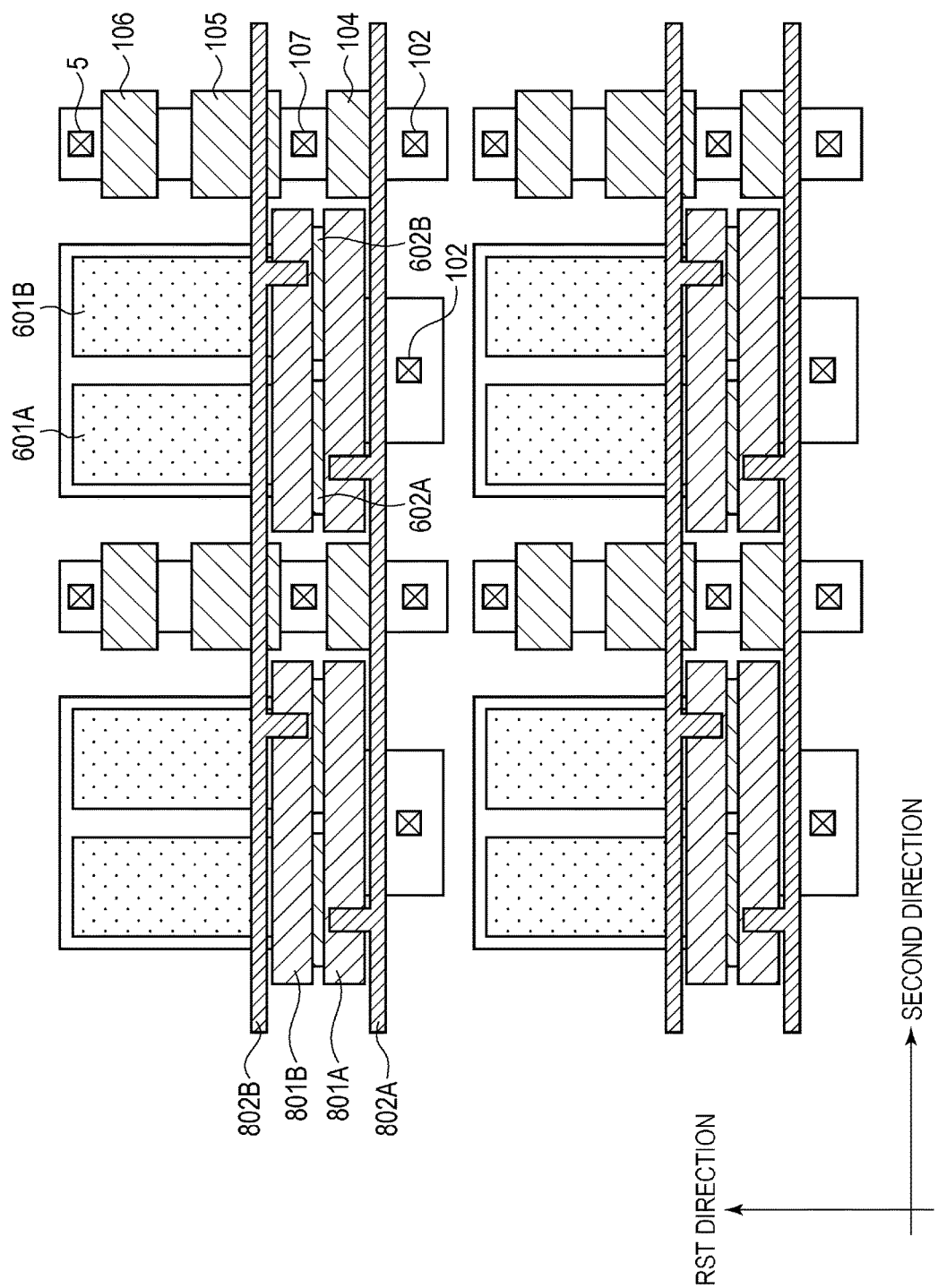
FIG. 9 is a schematic plan view of pixels according to a fifth embodiment.

FIG. 9 is a schematic view of the pixels 11 in a plan view according to the fifth embodiment. The circuit diagram of the pixel 11 of the present embodiment is the same as that of the fourth embodiment. Description of the same configuration will be omitted.

In the present embodiment, the shapes of connection wirings 801A and 801B and drive wirings 802A and 802B, which respectively correspond to the connection wirings 701A and 701B and the drive wirings 702A and 702B of the fourth embodiment, are different from those in the fourth embodiment. In the present embodiment, both of the connection wirings 801A and 801B are arranged in a region between the gate electrodes of the transfer transistors 602A and 602B in a plan view as illustrated in FIG. 9. According to the configuration of the present embodiment, since a light passing between the gate electrodes can be blocked by the connection wirings 801A and 801B, a noise due to refraction of an incident light at the gate electrodes can be further reduced.

Note that it is not essential in FIG. 9 that both of the connection wirings 801A and 802B be arranged in the region between the gate electrodes. The effect of reducing a noise is obtained as long as at least a part of at least one of the connection wirings 801A and 802B is arranged in at least a part of a region between the gate electrodes.

Sixth Embodiment

Figure 10:
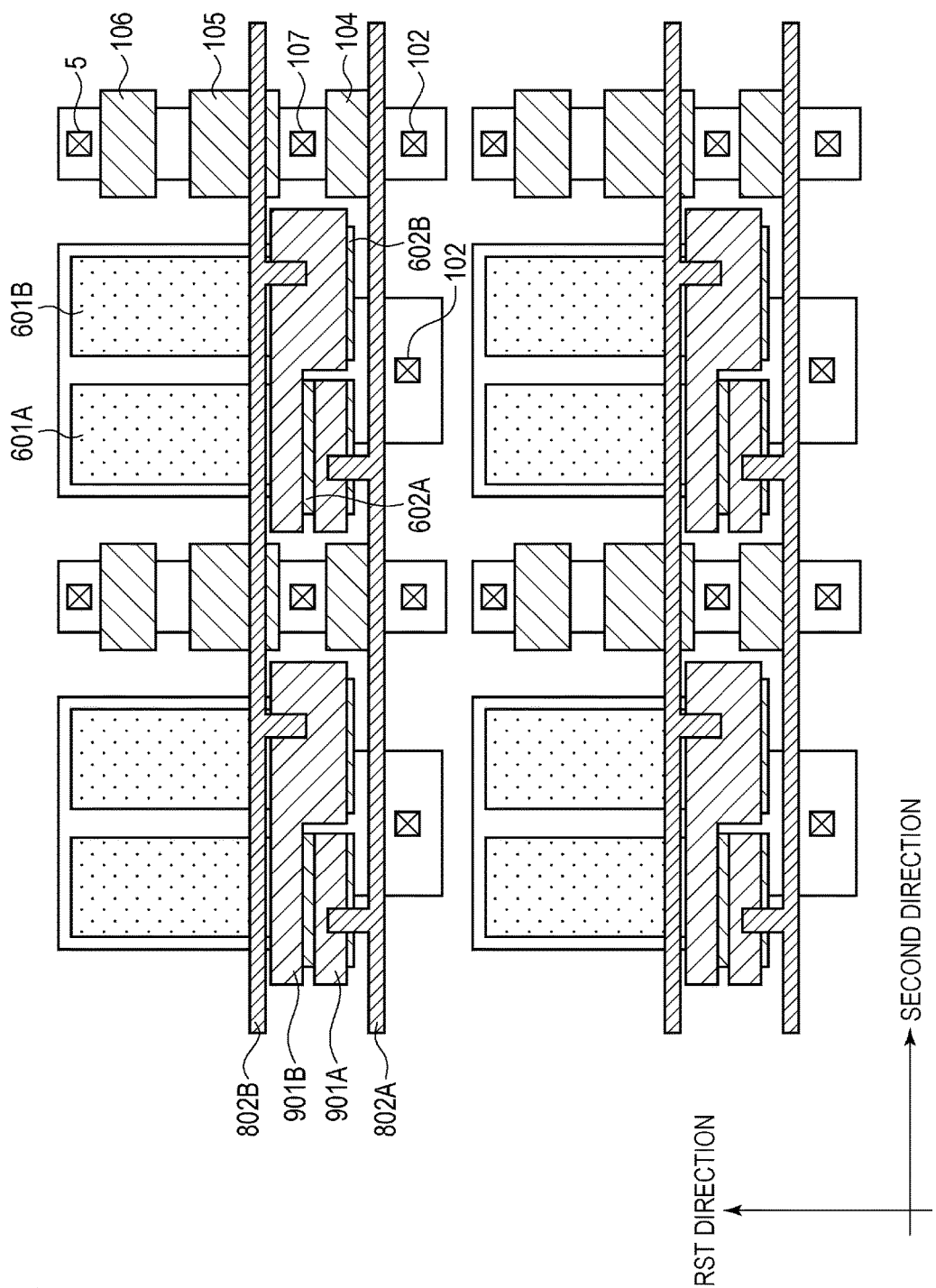
FIG. 10 is a schematic plan view of pixels according to a sixth embodiment.

FIG. 10 is a schematic view of the pixels 11 in a plan view according to the sixth embodiment. The circuit diagram of the pixel 11 of the present embodiment is the same as that of the fourth or fifth embodiment. Description of the same configuration will be omitted.

In the present embodiment, the shapes of connection wirings 901A and 901B, which respectively correspond to the connection wirings 801A and 801B of the fifth embodiment, are different from those in the fifth embodiment. In the present embodiment, as illustrated in FIG. 10, the area of the connection wiring 901A connected to the gate electrode of the transfer transistor 602A is smaller than the area of the connection wiring 901B connected to the gate electrode of the transfer transistor 602B. According to this configuration, the parasitic capacitance between the FD 102 and the transfer transistor 602A can be smaller than the parasitic capacitance between the FD 102 and the transfer transistor 602B.

The advantage of this configuration will be described. For example, one of the drive methods when reading out a signal used for focus detection by using a phase difference detection scheme is to turn on the transfer transistor 602A to read out a first signal and then turn on both the transfer transistors 602A and 602B to read out a second signal. In this drive method, when the first signal is read out, the potential of the FD 102 may change and the potentials of the FDs 102 may vary among the pixels 11 due to capacitance coupling between the FD 102 and the transfer transistor 602A. In this case, when the second signal is read out, the variation of the potentials of the FDs 102 may cause the second signals corresponding to image signals to vary among pixels.

According to the configuration of the present embodiment, it is possible to reduce variation of image signals among the pixels 11 by reducing the parasitic capacitance between the FD 102 and the transfer transistor 602A.

Seventh Embodiment

Figure 11:
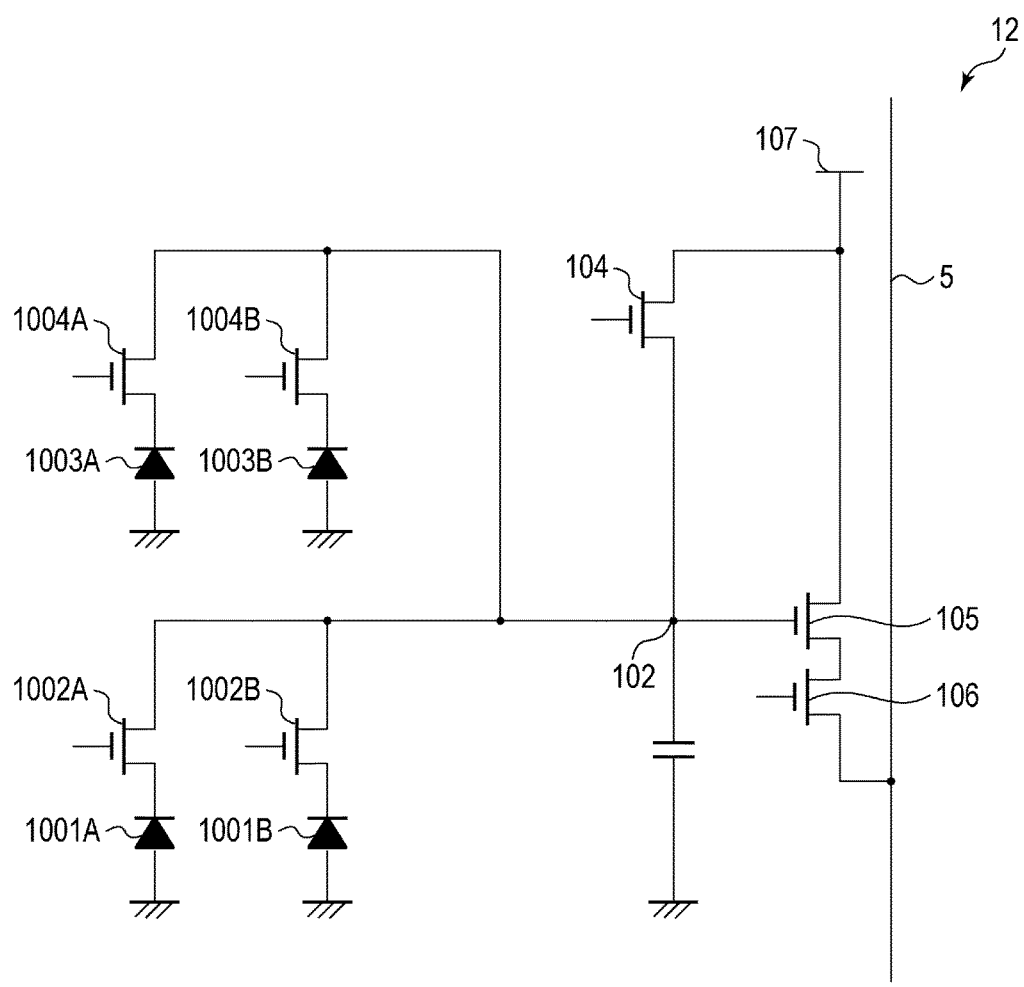
FIG. 11 is a circuit diagram of a pixel according to a seventh embodiment.
Figure 12:
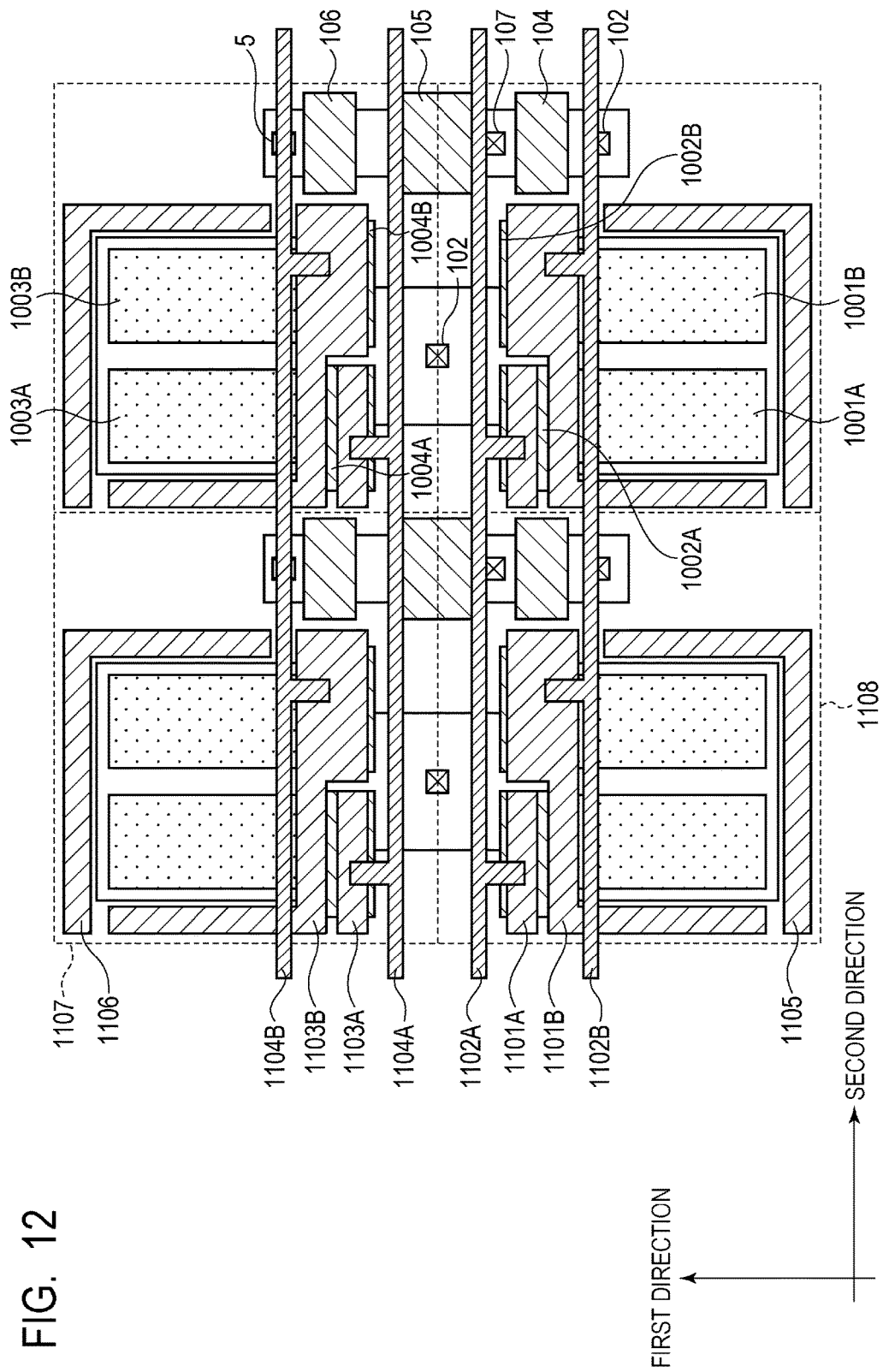
FIG. 12 is a schematic plan view of pixels according to the seventh embodiment.

FIG. 11 is a circuit diagram of a pixel 12 according to the seventh embodiment, and FIG. 12 is a schematic view of the pixel 12 in a plan view according to the seventh embodiment. The circuit configuration of the pixel 12 of the present embodiment will be described with reference to FIG. 11. Description of the same configuration as that of the first to sixth embodiments will be omitted.

The pixel 12 has photoelectric conversion portions 1001A, 1001B, 1003A, and 1003B and transfer transistors 1002A, 1002B, 1004A, and 1004B. Each of the photoelectric conversion portions 1001A, 1001B, 1003A, and 1003B is a photoelectric conversion element that may be formed of a photodiode or the like. When turned on, the transfer transistors 1002A, 1002B, 1004A, and 1004B transfer charges of the photoelectric conversion portions 1001A, 1001B, 1003A, and 1003B to the FD 102, respectively. That is, four photoelectric conversion portions 1001A, 1001B, 1003A, and 1003B and four transfer transistors 1002A, 1002B, 1004A, and 1004B share a single FD 102.

FIG. 12 is a schematic view of the pixels 11 in a plan view according to the seventh embodiment. Connection wirings 1101A, 1101B, 1103A, and 1103B and dummy wirings 1105 and 1106 are formed in the first wiring layer, which is the closest to the substrate, of the plurality of wiring layers arranged above the gate electrodes.

The connection wiring 1101A is a wiring that connects a gate electrode (first control electrode) of the transfer transistor 1002A (first transfer transistor) to a drive wiring 1102A. The connection wiring 1101B is a wiring that connects a gate electrode (second control electrode) of the transfer transistor 1002B (second transfer transistor) to a drive wiring 1102B. The connection wiring 1103A is a wiring that connects a gate electrode (third control electrode) of the transfer transistor 1004A (third transfer transistor) to a drive wiring 1104A. The connection wiring 1103B is a wiring that connects a gate electrode (fourth control electrode) of the transfer transistor 1004B (fourth transfer transistor) to a drive wiring 1104B.

The connection wiring 1101B and the dummy wiring 1105 are arranged so as to surround the outer circumference of the photoelectric conversion portion 1001A (first photoelectric conversion portion) and the photoelectric conversion portion 1001B (second photoelectric conversion portion) in a plan view. The connection wiring 1103B and the dummy wiring 1106 are arranged so as to surround the outer circumference of the photoelectric conversion portions 1003A (third photoelectric conversion portion) and 1003B (fourth photoelectric conversion portion) in a plan view.

That is, each outer circumference of each two of the four photoelectric conversion portions 1001A, 1001B, 1003A, and 1003B is surrounded by a wiring on the first wiring layer in a plan view. A first portion 1107 of the pixel 12 includes the photoelectric conversion portions 1003A and 1003B, and a second portion 1108 includes the photoelectric conversion portions 1001A and 1001B.

In the present embodiment, the first portion 1107 and the second portion 1108 are arranged in an axially symmetrical manner with respect to the center line of the pixel 12 to be symmetrically structured. In the case of such axially symmetrical structure, there may be a difference in output between the photoelectric conversion portions included in the first portion 1107 and the photoelectric conversion portions included in the second portion 1108. For example, when a light containing a component of the first direction of FIG. 12 enters the pixel 12, a light entering the second portion 1108 refracts at the gate electrodes of the transfer transistors 1002A and 1002B and enters the first portion 1107, which may cause a noise. On the other hand, a light entering the first portion 1107 does not enter the second portion 1108 even when refraction is caused by the transfer transistors 1004A and 1004B. Due to such a phenomenon, the output of the photoelectric conversion portions included in the first portion 1107 may be larger than that of the photoelectric conversion portions included in the second portion 1108.

According to the configuration of the present embodiment, the connection wiring and the dummy wiring are arranged such that each two of the four photoelectric conversion portions are surrounded in each of the first portion 1107 and the second portion 1108. Thereby, an incident light to the gate electrodes is blocked, which allows for a reduced difference in the output between the photoelectric conversion portions due to the above-described phenomenon.

Note that, of four sides forming the outer circumference of photoelectric conversion portions, the connection wiring 1101B surrounds the first side and the second side, and the dummy wiring 1105 surrounds the third side and the fourth side in FIG. 12. However, the connection wiring 1101B may surround the entire first side and a part of the second side and the dummy wiring 1105 may surround the entire third side and a part of the fourth side, and other wirings provided in the first wiring layer may further surround the remaining parts of the second and fourth sides. According to this form, it is not necessary to arrange wirings such that a single wiring surrounds substantially the entire two sides, which can increase flexibility of the layout of each wiring.

Further, as illustrated in FIG. 12, the solid state imaging device of the present embodiment is configured to have the same features as those of the third to sixth embodiments. Therefore, according to the seventh embodiment, the same advantages as those in the above embodiments can also be obtained.

Eighth Embodiment

Figure 13:
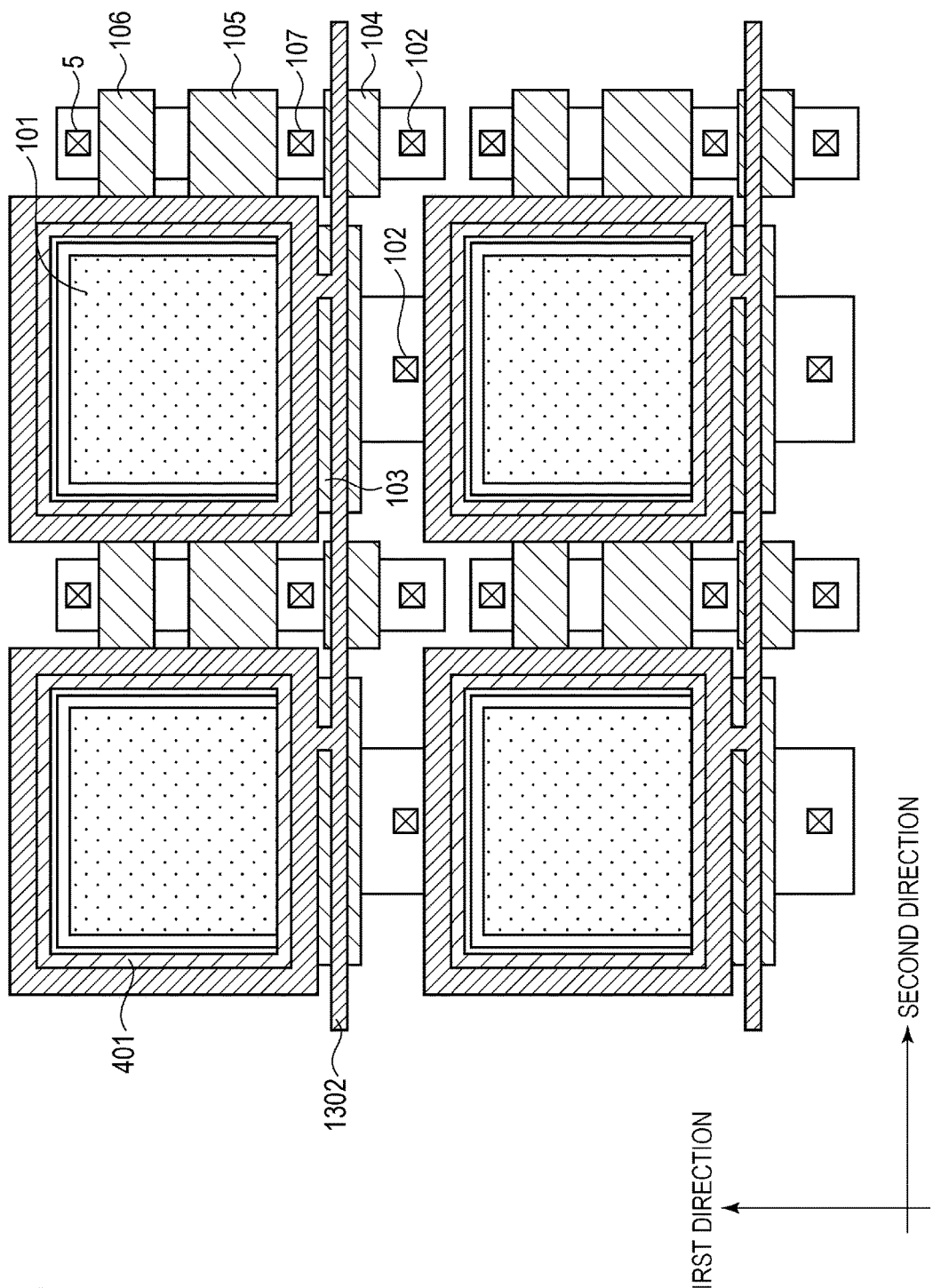
FIG. 13 is a schematic plan view of pixels according to an eighth embodiment.

FIG. 13 is a schematic view of pixels in a plan view according to the eighth embodiment. In the present embodiment, in addition to the connection wiring 401, a drive wiring 1302 (fourth wiring) corresponding to the drive wiring 202 of the first embodiment is arranged so as to surround the outer circumference of the photoelectric conversion portion 101. The drive wiring 1302 is formed in the second wiring layer. Since other elements than the drive wiring 1302 are the same as those of the second embodiment, the description thereof will be omitted.

This configuration has an advantage that not only the connection wiring 401 but also the drive wiring 1302 blocks incidence of a light to the gate electrode. Therefore, the present embodiment provides a photoelectric conversion device in which a noise is further reduced. Furthermore, in the present embodiment, the drive wiring 1302 surrounds the outer circumference of the photoelectric conversion portion 101 in a plan view resulting in the arrangement in which a light is blocked in a symmetrically manner in the first direction and the second direction in FIG. 13. Thus, the drive wiring 1302 of the present embodiment is arranged to have a better optical symmetry of an incident light compared to the second embodiment.

Here, in order to obtain the effect of blocking incidence of a light to the gate electrode of the transfer transistor 103 by the connection wiring 401, the outer circumference of the photoelectric conversion portion 101 may not be surrounded as a whole. Any shape may be employed as long as at least a part of the edge of the connection wiring 401 is shaped so as to extend along the edge of the gate electrode of the transfer transistor 103, in which the edge of the gate electrode is on the side facing the photoelectric conversion portion 101 in a plan view.

Note that, although the drive wiring 1302 surrounds the outer circumference of the photoelectric conversion portion 101 in a seamless manner in FIG. 13, the same advantages as described above of a reduced noise and an improved optical symmetry of an incident light are obtained as long as the drive wiring 1302, even when partially cut, substantially surrounds the outer circumference of the photoelectric conversion portion 101. Further, any wiring of the second wiring layer surrounding the outer circumference of the photoelectric conversion portion 101 may be employed as long as it includes the drive wiring 1302 and, for example, may include a dummy wiring other than the drive wiring 1302 as discussed in the third embodiment.

Ninth Embodiment

An imaging system according to the ninth embodiment of the present invention will be described by using FIG. 14. FIG. 14 is a block diagram illustrating a general configuration of the imaging system according to the present embodiment. The imaging system 1400 of the present embodiment has a solid state imaging device 1401 that is an example of the photoelectric conversion device according to any of the first to eighth embodiments.

While not limited in particular, the imaging system 1400 according to the present embodiment may be applicable to a digital still camera, a digital camcorder, a camera head, a copier machine, a fax machine, a cellular phone, an on-vehicle camera, an observation satellite, or the like, for example.

As illustrated in FIG. 14, the imaging system 1400 has a solid state imaging device 1401, a lens 1402, a diaphragm 1404, a barrier 1406, a signal processing unit 1408, a timing generating unit 1410, and a general control and calculation unit 1412. The imaging system 1400 further has a memory unit 1414, a storage medium control I/F unit 1416, and an external I/F unit 1418.

The lens 1402 captures an optical image of an object onto a pixel region of the solid state imaging device 1401. The diaphragm 1404 changes the amount of a light passing through the lens 1402. The barrier 1406 protects the lens 1402. The solid state imaging device 1401 is the photoelectric conversion device described in any of the first to eighth embodiments and outputs a signal based on an optical image captured by the lens 1402 to the signal processing unit 1408.

The signal processing unit 1408 performs desired processing, correction, data compression, or the like on a signal output from the solid state imaging device 1401. The signal processing unit 1408 may include an analog-to-digital convertor that converts an analog signal output from the solid state imaging device 1401 into a digital signal and a digital signal processor that processes a digital signal output from the analog-to-digital convertor. The signal processing unit 1408 may be implemented on the same substrate as the solid state imaging device 1401 or may be implemented on a different substrate. Further, a part of the functions of the signal processing unit 1408 may be implemented on the same substrate as the solid state imaging device 1401, and another part of the function of the signal processing unit 1408 may be implemented on a different substrate.

The timing generating unit 1410 outputs various timing signals to the solid state imaging device 1401 and the signal processing unit 1408. The general control and calculation unit 1412 is a control unit that is responsible for drive or calculation processing of the entire imaging system 1400. Here, the timing signal or the like may be input from the outside of the imaging system 1400, and the imaging system 1400 may be any system as long as it has at least the solid state imaging device 1401 and the signal processing unit 1408 that processes the signal output from the solid state imaging device 1401.

The memory unit 1414 is a frame memory unit for temporarily storing image data. The storage medium control I/F unit 1416 is an interface unit for storage to the storage medium 1420 or readout from the storage medium 1420. The external I/F unit 1418 is an interface unit for communicating with an external computer or the like. The storage medium 1420 is a removable storage medium such as a semiconductor memory or the like for performing storage or readout of captured data or may be a storage medium built in the imaging system 1400.

As discussed above, the solid state imaging device 1401, which is an example of the photoelectric conversion device according to the first to eighth embodiments, can be applied to form the imaging system 1400. Since the photoelectric conversion devices according to the first to eighth embodiments have the advantage of noise reduction, an imaging system capable of capturing an image of better image quality can be realized.

Other Embodiments

The present invention can be implemented in various forms without departing from the technical concept thereof or the primary feature thereof. For example, it should be appreciated that an embodiment in which a part of the configuration of any of the embodiments is added to another embodiment or an embodiment in which a part of the configuration of any of the embodiments is replaced with a part of the configuration of another embodiment is one of the embodiments to which the present invention may be applied.

The conduction type of the impurity diffusion region formed inside the semiconductor substrate is a mere example and is not limited to the conduction type in the embodiments described above. For example, P-type and N-type may be opposite in all the impurity diffusion regions.

Further, the imaging system illustrated in the ninth embodiment is an example of an imaging system to which the imaging device of the present invention may be applied, and an imaging system to which the photoelectric conversion device of the present invention can be applied is not limited to those having the configuration illustrated in FIG. 13. For example, the photoelectric conversion device of any of the first to eighth embodiments may be used as a focus detection device to form the imaging system.

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-134910, filed Jul. 7, 2016, which is hereby incorporated by reference herein in its entirety.

What is claimed is:

1. A photoelectric conversion device comprising:
 a substrate;
 a first photoelectric conversion portion that is formed in the substrate and photoelectrically converts an incident light to generate charges;
 a first transfer transistor that includes a first control electrode formed on the substrate and transfers the charges from the first photoelectric conversion portion;
 a plurality of wiring layers arranged above the first control electrode;
 a first wiring included in a first wiring layer of the plurality of wiring layers, the first wiring layer being the closest to the substrate;
 a drive wiring included in a second wiring layer arranged above the first wiring layer; and
 a scanning circuit that outputs a control signal for controlling the first transfer transistor,
 wherein the control signal is transferred to the first control electrode via the drive wiring and the first wiring, and
 wherein at least a part of the first wiring is arranged so as to overlap with at least a part of the first control electrode in a plan view, and at least a part of an edge of the first wiring is arranged so as to extend along an edge of the first control electrode, the edge of the first control electrode being on a side facing the first photoelectric conversion portion, in a plan view.

2. The photoelectric conversion device according to claim 1, wherein the at least a part of the edge of the first wiring is arranged so as to extend along at least a part of an edge of the first photoelectric conversion portion in a plan view.

3. The photoelectric conversion device according to claim 1, wherein the first wiring is formed of a material that does not transmit a visible light.

4. The photoelectric conversion device according to claim 1, wherein the first wiring is arranged so as to surround an outer circumference of the first photoelectric conversion portion in a plan view.

5. The photoelectric conversion device according to claim 1, wherein the first wiring layer further includes a second wiring, and at least a part of an edge of the second wiring is arranged so as to extend along at least a part of an edge of the first photoelectric conversion portion in a plan view.

6. The photoelectric conversion device according to claim 5, wherein the second wiring is arranged at a position opposite to the first wiring, the first wiring and the second wiring interposing the first photoelectric conversion portion, in a plan view.

7. The photoelectric conversion device according to claim 5, wherein wirings of the first wiring layer including the first wiring and the second wiring are arranged so as to surround an outer circumference of the first photoelectric conversion portion in a plan view.

8. The photoelectric conversion device according to claim 5, wherein the second wiring is a dummy wiring which is in a floating state or which is supplied with a predetermined potential.

9. The photoelectric conversion device according to claim 1 further comprising:
 a second photoelectric conversion portion that is formed in the substrate and photoelectrically converts an incident light to generate charges;
 a second transfer transistor that includes a second control electrode formed on the substrate and transfers the charges from the second photoelectric conversion portion; and
 a floating diffusion to which the charges are transferred by the first transfer transistor and the second transfer transistor,
 wherein the first wiring layer further includes a third wiring, and
 wherein at least a part of the third wiring is arranged so as to overlap with the second control electrode in a plan view.

10. The photoelectric conversion device according to claim 9, wherein at least a part of an edge of the third wiring is arranged so as to extend along at least a part of an edge of the second control electrode, the edge of the second control electrode being on a side facing the second photoelectric conversion portion, in a plan view.

11. The photoelectric conversion device according to claim 9, wherein at least a part of at least one of the first wiring and the third wiring is arranged in at least a part of a region between the first control electrode and the second control electrode in a plan view.

12. The photoelectric conversion device according to claim 9, wherein the first wring is connected to the first control electrode, the third wiring is connected to the second control electrode, and the first wiring and the third wiring have different areas.

13. The photoelectric conversion device according to claim 1 further comprising:
 a second photoelectric conversion portion that is formed in the substrate and photoelectrically converts an incident light to generate charges;
 a third photoelectric conversion portion that is formed in the substrate and photoelectrically converts an incident light to generate charges;
 a fourth photoelectric conversion portion that is formed in the substrate and photoelectrically converts an incident light to generate charges;

a second transfer transistor that includes a second control electrode formed on the substrate and transfers the charges from the second photoelectric conversion portion;
a third transfer transistor that includes a third control electrode formed on the substrate and transfers the charges from the third photoelectric conversion portion;
a fourth transfer transistor that includes a fourth control electrode formed on the substrate and transfers the charges from the fourth photoelectric conversion portion; and
a floating diffusion to which the charges are transferred by the first transfer transistor, the second transfer transistor, the third transfer transistor, and the fourth transfer transistor,
wherein each outer circumference of each two of the first photoelectric conversion portion, the second photoelectric conversion portion, the third photoelectric conversion portion, and the fourth photoelectric conversion portion is surrounded by a wiring on the first wiring layer in a plan view.

14. The photoelectric conversion device according to claim 1, wherein at least a part of an edge of the drive wiring is arranged so as to extend along an edge of the first control electrode, the edge of the first control electrode being on a side facing the first photoelectric conversion portion, in a plan view.

15. The photoelectric conversion device according to claim 14, wherein a wiring of the second wiring layer including the drive wiring is arranged so as to surround an outer circumference of the first photoelectric conversion portion in a plan view.

16. The photoelectric conversion device according to claim 1 further comprising a contact portion through which the first wiring and the drive wiring are connected,
wherein the first wiring includes a first part arranged between the contact portion and the first photoelectric conversion portion in a plan view.

17. The photoelectric conversion device according to claim 16, wherein the first part is arranged so as to overlap with at least a part of the first control electrode in a plan view.

18. The photoelectric conversion device according to claim 16, wherein the first part is arranged so as to overlap with at least a part of the first control electrode and so as not to overlap with the drive wiring in a plan view.

19. The photoelectric conversion device according to claim 18 further comprising:
a second photoelectric conversion portion that is formed in the substrate and photoelectrically converts an incident light to generate charges;
a second transfer transistor that includes a second control electrode formed on the substrate and transfers the charges from the second photoelectric conversion portion; and
a floating diffusion to which the charges are transferred by the first transfer transistor and the second transfer transistor,
wherein the first part is arranged so as to overlap with at least a part of the second control electrode of the second transfer transistor in a plan view.

20. The photoelectric conversion device according to claim 19, wherein a signal from the first photoelectric conversion portion and a signal from the second photoelectric conversion portion are used for focus detection by using a phase difference detection scheme.

21. The photoelectric conversion device according to claim 1 further comprising:
a second photoelectric conversion portion that is formed in the substrate and photoelectrically converts an incident light to generate charges;
a second transfer transistor that includes a second control electrode formed on the substrate and transfers the charges from the second photoelectric conversion portion; and
a floating diffusion to which the charges are transferred by the first transfer transistor and the second transfer transistor,
wherein at least a part of the first wiring is arranged so as to overlap with at least a part of the second control electrode of the second transfer transistor in a plan view.

22. The photoelectric conversion device according to claim 21, wherein a signal from the first photoelectric conversion portion and a signal from the second photoelectric conversion portion are used for focus detection by using a phase difference detection scheme.

23. The photoelectric conversion device according to claim 21,
wherein, in a plan view, the first photoelectric conversion portion and the second photoelectric conversion portion are arranged adjacent in a first direction,
wherein the first wiring includes, in a plan view, a first part extending in the first direction and a second part extending in a second direction perpendicular to the first direction, and
wherein the first part is arranged so as to overlap with at least a part of the first control electrode and at least a part of the second control electrode in a plan view.

24. The photoelectric conversion device according to claim 21, wherein the first wiring includes a first part arranged so as not to overlap with the drive wiring in a plan view.

25. The photoelectric conversion device according to claim 24 further comprising a contact portion through which the first wiring and the drive wiring are connected,
wherein the first part is arranged between the contact portion and the first photoelectric conversion portion in a plan view.

26. An imaging system comprising:
a photoelectric conversion device including
a substrate;
a first photoelectric conversion portion that is formed in the substrate and photoelectrically converts an incident light to generate charges;
a first transfer transistor that includes a first control electrode formed on the substrate and transfers the charges from the first photoelectric conversion portion;
a plurality of wiring layers arranged above the first control electrode;
a first wiring included in a first wiring layer of the plurality of wiring layers, the first wiring layer being the closest to the substrate;
a drive wiring included in a second wiring layer arranged above the first wiring layer; and
a scanning circuit that outputs a control signal for controlling the first transfer transistor,
wherein the control signal is transferred to the first control electrode via the drive wiring and the first wiring, and
wherein at least a part of the first wiring is arranged so as to overlap with at least a part of the first control electrode in a plan view, and at least a part of an edge of the first wiring is arranged so as to extend along an edge of the first control electrode, the edge of the first control electrode being on a side facing the first photoelectric conversion portion, in a plan view; and
a signal processing unit that processes a signal output from the photoelectric conversion device.

27. A photoelectric conversion device comprising:
a first photoelectric conversion portion;
a second photoelectric conversion portion arranged adjacent to the first photoelectric conversion portion;
a first transfer transistor that includes a first control electrode and transfers charges from the first photoelectric conversion portion;
a second transfer transistor that includes a second control electrode and transfers charges from the second photoelectric conversion portion;
a plurality of wiring layers including a first wiring layer and a second wiring layer, arranged above the first control electrode and the second control electrode, the first wiring layer being the closest to the substrate, and the second wiring layer arranged above the first wiring layer; and
a scanning circuit that outputs a control signal for controlling the first transfer transistor,
wherein the control signal is transferred to the first control electrode via a drive wiring included in the second wiring layer and a first wiring included in the first wiring layer, and
wherein the first wiring is arranged so as to overlap with the first control electrode and the second control electrode, in a plan view.

28. The photoelectric conversion device according to claim 27,
wherein the first wiring layer includes a second wiring, and
wherein the second wiring is arranged at a position opposite to the first wiring arranged so as to overlap with the first control electrode, the first wiring and the second wiring interposing the first photoelectric conversion portion, in a plan view.

29. The photoelectric conversion device according to claim 28, wherein the second wiring is arranged at a position opposite to the first wiring arranged so as to overlap with the second control electrode, the first wiring and the second wiring interposing the second photoelectric conversion portion, in a plan view.

30. The photoelectric conversion device according to claim 29, wherein the second wiring is arranged so as to extend in a first direction, the first photoelectric conversion portion and the second photoelectric conversion portion being arranged side by side in the first direction.

31. The photoelectric conversion device according to claim 30, wherein the second wiring is arranged so as to extend in a second direction intersecting the first direction.

32. A photoelectric conversion device comprising:
a first photoelectric conversion portion;
a second photoelectric conversion portion arranged adjacent to the first photoelectric conversion portion in a first direction;
a third photoelectric conversion portion arranged apart from the first photoelectric conversion portion in a second direction intersecting the first direction;
a fourth photoelectric conversion portion arranged adjacent to the third photoelectric conversion portion in the first direction;
a first transfer transistor that includes a first control electrode and transfers charges from the first photoelectric conversion portion to a floating diffusion;
a second transfer transistor that includes a second control electrode and transfers charges from the second photoelectric conversion portion to the floating diffusion;
a third transfer transistor that includes a third control electrode and transfers charges from the third photoelectric conversion portion to the floating diffusion;
a fourth transfer transistor that includes a fourth control electrode and transfers charges from the fourth photoelectric conversion portion to the floating diffusion;
a plurality of wiring layers including a first wiring layer and a second wiring layer, arranged above the first control electrode, the second control electrode, the third control electrode, and the fourth control electrode, the first wiring layer being the closest to the substrate and the second wiring layer arranged above the first wiring layer; and
a scanning circuit that outputs a first control signal for controlling the first transfer transistor,
wherein the first control signal is transferred to the first control electrode via a first drive wiring included in the second wiring layer and a first wiring included in the first wiring layer,
wherein the first wiring is arranged so as to overlap with the first control electrode and so as to extend in the first direction, in a plan view,
wherein a second wiring included in the first wiring layer is arranged at a position opposite to the first wiring arranged so as to overlap with the first control electrode, the first wiring and the second wiring interposing the first photoelectric conversion portion, in a plan view, and
wherein the second wiring is arranged so as to extend in the first direction.

33. The photoelectric conversion device according to claim 32,
wherein the scanning circuit further outputs a second control signal for controlling the third transfer transistor,
wherein the second control signal is transferred to the third control electrode via a second drive wiring included in the second wiring layer and a third wiring included in the first wiring layer, and
wherein the third wiring is arranged so as to overlap with the third control electrode and so as to extend in the first direction, in a plan view.

34. The photoelectric conversion device according to claim 33,
wherein a fourth wiring included in the first wiring layer is arranged at a position opposite to the third wiring arranged so as to overlap with the third control electrode, the third wiring and the fourth wiring interposing the third photoelectric conversion portion, in a plan view, and
wherein the fourth wiring is arranged so as to extend in the first direction.

35. The photoelectric conversion device according to claim 34,
wherein the first wiring is arranged so as to overlap with the second control electrode in a plan view, and
wherein the third wiring is arranged so as to overlap with the fourth control electrode in a plan view.

36. The photoelectric conversion device according to claim 35, wherein the second wiring is arranged at a position opposite to the first wiring arranged so as to overlap with the second control electrode, the first wiring and the second wiring interposing the second photoelectric conversion portion, in a plan view, and wherein the fourth wiring is arranged at a position opposite to the third wiring arranged so as to overlap with the fourth control electrode, the third wiring and the fourth wiring interposing the second photoelectric conversion portion, in a plan view.

* * * * *